US008618575B2

(12) United States Patent
Walter

(10) Patent No.: US 8,618,575 B2
(45) Date of Patent: Dec. 31, 2013

(54) LIGHT EMITTING AND LASING SEMICONDUCTOR METHODS AND DEVICES

(75) Inventor: Gabriel Walter, Madison, WI (US)

(73) Assignee: Quantum Electro Opto Systems Sdn. Bhd., Melaka ( * ) Notice: Subject to any disclaimer, the term of this patent is extended or adjusted under 35 U.S.C. 154(b) by 0 days.

(21) Appl. No.: 13/200,168

(22) Filed: Sep. 20, 2011

(65) Prior Publication Data
US 2012/0068151 A1    Mar. 22, 2012

Related U.S. Application Data

(60) Provisional application No. 61/403,748, filed on Sep. 21, 2010.

(51) Int. Cl.
*H01L 33/32* (2010.01)

(52) U.S. Cl.
USPC .......................................................... 257/103

(58) Field of Classification Search
USPC ............... 257/13, 14, 9, E33.005, E33.023, 257/E33.013, 79, 81, 84, 99, 103, 376, 590, 257/197, 198, E33.003, E33.004, E33.014, 257/E33.043; 438/37, 46, 22
See application file for complete search history.

(56) References Cited

U.S. PATENT DOCUMENTS

| 7,091,082 B2 | 8/2006 | Feng et al. ................ 438/235 |
| 7,286,583 B2 | 10/2007 | Feng et al. .................. 372/30 |
| 7,354,780 B2 | 4/2008 | Feng et al. ................ 257/292 |
| 7,535,034 B2 | 5/2009 | Walter et al. ................ 372/43 |
| 7,711,015 B2 | 5/2010 | Holonyak et al. ............... 372/11 |
| 7,813,396 B2 | 10/2010 | Feng et al. ................ 372/43.01 |
| 2002/0020851 A1* | 2/2002 | Sakuma ..................... 257/197 |
| 2005/0040387 A1 | 2/2005 | Feng et al. .................. 257/14 |
| 2005/0040432 A1 | 2/2005 | Feng et al. ................ 257/198 |
| 2005/0054172 A1 | 3/2005 | Feng et al. ................ 438/313 |

(Continued)

FOREIGN PATENT DOCUMENTS

| JP | 61270885 | | 12/1986 | |
| WO | WO 2009/076933 | * | 6/2009 | ......... H01L 33/08 |

OTHER PUBLICATIONS

Device Performance of Light Emitting Transistors With C-Doped and Zn-Doped Base Layers, Y. Huang, J.-H. Ryou, R.D. Dupuis, F. Dixon, N. Holonyak, Jr., and M. Feng, IPRM '09 IEEE Intl. Conf. May 10-14, 2009.*

(Continued)

*Primary Examiner* — Jay C Chang
(74) *Attorney, Agent, or Firm* — Martin Novack

(57) ABSTRACT

The invention is applicable for use in conjunction with a light-emitting semiconductor structure that includes a semiconductor active region of a first conductivity type containing a quantum size region and having a first surface adjacent a semiconductor input region of a second conductivity type that is operative, upon application of electrical potentials with respect to the active and input regions, to produce light emission from the active region. A method is provided that includes the following steps: providing a semiconductor output region that includes a semiconductor auxiliary layer of the first conductivity type adjacent a second surface, which opposes the first surface of the active region, and providing the auxiliary layer as a semiconductor material having a diffusion length for minority carriers of the first conductivity type material that is substantially shorter than the diffusion length for minority carriers of the semiconductor material of the active region.

16 Claims, 7 Drawing Sheets

(56) References Cited

U.S. PATENT DOCUMENTS

| | | | |
|---|---|---|---|
| 2005/0116234 A1 | 6/2005 | Sumakeris et al. | 257/77 |
| 2007/0201523 A1* | 8/2007 | Walter et al. | 372/43.01 |
| 2008/0089368 A1 | 4/2008 | Feng et al. | 372/25 |
| 2008/0240173 A1 | 10/2008 | Holonyak et al. | 372/9 |
| 2008/0283818 A1 | 11/2008 | Odnoblyudov et al. | 257/13 |
| 2009/0134939 A1 | 5/2009 | Feng et al. | 327/581 |
| 2010/0032008 A1 | 2/2010 | Adekore | 136/255 |
| 2010/0034228 A1 | 2/2010 | Holonyak et al. | 374/45 |
| 2010/0073086 A1 | 3/2010 | Holonyak, Jr. et al. | 330/149 |
| 2010/0103971 A1 | 4/2010 | Then et al. | 372/45.01 |
| 2010/0202483 A1 | 8/2010 | Walter et al. | 372/45.01 |
| 2010/0202484 A1 | 8/2010 | Holonyak, Jr. et al. | 372/45.01 |
| 2010/0264843 A1* | 10/2010 | Herrmann | 315/291 |
| 2010/0272140 A1 | 10/2010 | Walter et al. | 372/38.02 |
| 2010/0289427 A1 | 11/2010 | Walter et al. | 315/219 |
| 2010/0315018 A1 | 12/2010 | Then et al. | 315/291 |
| 2011/0150487 A1 | 6/2011 | Walter | 398/115 |

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan, N. Holonyak, Jr., A. James, G. Walter, Appl. Phys. Lett. 88, 143508 (2006).

Collector Breakdown in the Heterojunction Bipolar Transistor laser, G. Walter, A. James, N. Holonyak, Jr., M. Feng, and R. Chan, Appl. Physics Lett. 88, 232105 (2006).

High-Speed (≥GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n. Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 μm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr., Appl. Phys. Lett. 93, 163504 (2008).

Bandwidth Extension by Trade-Off of Electrical and Optical Gain in a Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

Electrical-Optical Signal Mixing and Multiplication (2→22 GHz) With a Tunnel Junction Transistor Laser, H.W. Then, C.H. Wu, G. Walter, M. Feng and N. Holonyak, Jr., Appl. Phys. Lett. 94, 10114 (2009).

Scaling of Light Emitting Transistor for Multigigahertz Optical Bandwidth, C.H. Wu, G. Walter, H.W. Then, M. Feng and N. Holonyak, Jr., Appl. Phys. Lett. 94, 171101 (2009).

Tilted-Charge High Speed (7 GHz) Light Emitting Diode, G. Walter, C. H. Wu, H. W. Then, M. Feng, and N. Holonyak, Jr., Appl. Phys. Lett. 94, 231125 (2009).

4.3 GHz Optical Bandwidth Light Emitting Transistor, G. Walter, C. H. Wu, H. W. Then, M. Feng, and N. Holonyak, Jr., Appl. Phys. Lett. 94, 241101 (2009).

Resonance-Free Frequency Response of a Semiconductor Laser, M: Feng, H. W. Then, N. Holonyak, Jr., G. Walter, and A. James, Appl. Phys. Lett, 95, 033509 (2009).

4-GHz Modulation Bandwidth of Integrated 2X2 LED Array, Chao-Hsin Wu; Walter, G.; Han Wui Then; Feng, M.; Holonyak, N.; Photonics Technology Letters, IEEE vol. 21, Issue: 24 (2009).

Physics of Base Charge Dynamics in the Three Port Transistor Laser, H. W. Then, M. Feng, and N. Holonyak, Appl. Phys. Lett. 96, 113509 (2010).

Microwave Circuit Model of the Three-Port Transistor Laser, H. W. Then, M. Feng, and N. Holonyak, J. Appl. Phys. 107, 094509 (2010).

Distributed Feedback Transistor Laser, F. Dixon, M. Feng, and N. Holonyak, Appl. Phys. Lett. 96, 241103 (2010).

Stochastic Base Doping and Quantum-Well Enhancement of Recombination in an n-p-n Light-Emitting Transistor or Transistor Laser, H. W. Then, C. H. Wu, M. Feng, N. Holonyak, and G. Walter, Appl. Phys. Lett. 96, 263505 (2010).

* cited by examiner

LIGHT EMITTING AND LASING SEMICONDUCTOR METHODS AND DEVICES

PRIORITY CLAIM

Priority is claimed from U.S. Provisional Patent Application No. 61/403,748, filed Sep. 21, 2010, and said U.S. Provisional Patent Application is incorporated herein by reference.

FIELD OF THE INVENTION

This invention relates to methods and devices for producing light emission and laser emission in response to electrical signals. The invention also relates to methods and devices for producing light emission and laser emission from semiconductor devices with improved efficiency and speed, and to increasing light output from semiconductor light-emitting devices.

BACKGROUND OF THE INVENTION

A part of the background hereof lies in the development of heterojunction bipolar transistors which operate as light-emitting transistors and transistor lasers. Reference can be made, for example, to U.S. Pat. Nos. 7,091,082, 7,286,583, 7,354,780, 7,535,034 and 7,693,195; U.S. Patent Application Publication Numbers US2005/0040432, US2005/0054172, US2008/0240173, US2009/0134939, US2010/0034228, US2010/0202483, and US2010/0202484; and to PCT International Patent Publication Numbers WO/2005/020287 and WO/2006/093883. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping, H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007); Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008); Optical Bandwidth Enhancement Of Heterojunction Bipolar Transistor Laser Operation With An Auxiliary Base Signal, H. W. Then, G. Walter, M. Feng, and N. Holonyak, Jr. Appl. Phys. Lett. 93, 163504 (2008); Bandwidth Extension By Trade-Off Of Electrical And Optical Gain In A Transistor Laser: Three-Terminal Control, H. W. Then, M. Feng, and N. Holonyak, Jr. Appl. Phys. Lett. 94, 013509 (2009); Tunnel Junction Transistor Laser, M. Feng, N. Holonyak, Jr., H. W. Then, C. H. Wu, and G. Walter Appl. Phys. Lett. 94, 041118 (2009); Electrical-Optical Signal Mixing And Multiplication (2→22 GHz) With A Tunnel Junction Transistor Laser, H. W. Then, C. H. Wu, G. Walter, M. Feng, and N. Holonyak, Jr. Appl. Phys. Lett. 94, 101114 (2009); Scaling Of Light Emitting Transistor For Multigigahertz Optical Bandwidth, C. H. Wu, G. Walter, H. W. Then, M. Feng, and N. Holonyak, Jr. Appl. Phys. Lett. 94, 171101 (2009). Device Performance Of Light Emitting Transistors With C-Doped And Zn-Doped Base Layers, Huang, Y., Ryou, J.-H., Dupuis, R. D., Dixon, F., Holonyak, N., Feng, M., Indium Phosphide & Related Materials, 2009; IPRM '09. IEEE International Conference, 10-14 May 2009, Pages 387-390; Tilted-Charge High Speed (7 GHz) Light Emitting Diode, G. Walter, C. H. Wu, H. W. Then, M. Feng, and N. Holonyak, Jr. Appl. Phys. Lett. 94, 231125 (2009); 4.3 GHz Optical Bandwidth Light Emitting Transistor, G. Walter, C. H. Wu, H. W. Then, M. Feng, and N. Holonyak, Jr. Appl. Phys. Lett. 94, 241101 (2009); and Resonance-Free Frequency Response Of A Semiconductor Laser, M. Feng, H. W. Then, N. Holonyak, Jr., G. Walter, and A. James Appl. Phys. Lett. 95, 033509 (2009).

In tilted-charge light-emitting devices, including those described in the above-referenced patents, patent application publications, and published papers, trade-offs in device design arise when striving to maximize light output, response time (speed) of operation, and ease of fabrication.

It is among the objects of the present invention to address these trade-offs and other limitations of existing tilted-charge light emitting devices and methods.

SUMMARY OF THE INVENTION

The high speed optical capability of a tilted charge device depends on the ability of the device to maintain charge tilt in the active region (typically, base region) of the device. (A charge tilt is characterized by a ramp in the device's energy diagram which has a small initial value at the base-collector or base-drain junction. If there is a charge build-up at this junction, the advantageous charge tilt characteristic will not exist.) A charge tilt is enabled by ensuring that minority charges that do not recombine in the regions of desired optical recombination (e.g. quantum well(s), quantum dots, etc.) are collected or drained by a faster secondary mechanism (such as the collector of a transistor or the drain of a tilted-charge light emitting diode). The intrinsic high speed capability of the device is this limited by the time required to access to thus secondary mechanism, also known as the transit time, $\tau_t$.

The transistor, a structure comprising an emitter, base and collector, can be an excellent device to use for material study. Emitter gain $\beta$, a metric of the ratio of the collector current Ic, to the base current, Ib ($\beta$=Ic/Ib), can also be given as the ratio of the base recombination time over the base transit time $\tau_B/\tau_t$. Therefore, for transistors of comparable junction characteristics, similar physical dimensions and base resistivity, a lower beta device usually indicates smaller (hence, faster) base recombination lifetime.

By using the transistor technique to study the recombination lifetime of a base material, Applicant found that the defect levels in a highly doped semiconductor material can be controlled through growth variations such as doping concentration, gas flow and growth temperature. By increasing the defect levels in a layer, the recombination speed of that layer increases, resulting in a device with much lower $\beta$. Applicant has also found that alloys such as AlGaAs are more prone to such decrease in recombination lifetime when compared to binary systems such as GaAs. (As will be treated hereinbelow, diffusion length for minority carriers in a semiconductor material is inversely related to defect concentration in the material.) Applicant also found that transistors with $\beta$ as low as 0.01 (that is, 99% of minority carrier recombined within a single pass of the base region) could be achieved, indicating that a very fast non-radiative recombination material is possible via defect engineering. Importantly, the engineering of defects can be done without degrading the majority carrier electrical characteristics (resistivity) of the layer. This fast recombination characteristic indicates that an engineered high defect layer (or engineered short diffusion length layer) may be used as an effective secondary mechanism for collection/draining of excess minority carriers. Also, combinations one or more of engineered high defect concentration layers (short diffusion length layers) and one or more engineered low defect concentration layers (long diffusion length layers) in design of a tilted-charge light-emitting devices can provide substantial advantage.

As was noted above, diffusion length for minority carriers in a semiconductor material is inversely related to defect concentration in the material. Although either defect concentration or its inverse, diffusion length, can be used in describing certain layers employed in the invention, diffusion length will be the metric that is primarily used in the subsequent description and claims hereof. It will be understood throughout, however, that defect concentration, employed in the inverse sense, is an implied alternative.

A form of the invention is applicable for use in conjunction with a light-emitting semiconductor structure that includes a semiconductor active region of a first conductivity type containing a quantum size region and having a first surface adjacent a semiconductor input region of a second conductivity type that is operative, upon application of electrical potentials with respect to said active and input regions, to produce light emission from said active region. A method is provided for enhancing operation of said light-emitting semiconductor structure, comprising the following steps: providing a semiconductor output region that includes a semiconductor auxiliary layer of said first conductivity type adjacent a second surface, which opposes said first surface of said active region, and providing said auxiliary layer as comprising a semiconductor material having a diffusion length for minority carriers of said first conductivity type material that is substantially shorter than the diffusion length for minority carriers of the semiconductor material of said active region.

In an embodiment of this form of the invention, the step of providing said output region further includes providing a semiconductor drain region of said second conductivity type adjacent said semiconductor auxiliary layer.

In another embodiment of this form of the invention, the step of providing said output region further includes providing a semiconductor collector region of said second conductivity type adjacent said semiconductor auxiliary layer.

Also, in an embodiment of this form of the invention, the step of providing said output region that includes a semiconductor auxiliary layer adjacent said second surface of said active region comprises providing said auxiliary layer of a semiconductor material having substantially the same elemental constituents as the semiconductor material of said second surface of said active region. In one embodiment hereof, both of said semiconductor materials are substantially GaAs, but with respective different concentrations of defects (and, accordingly, different diffusion lengths for minority carriers).

In another form of the invention, a method is set forth for producing light emission from a semiconductor structure, including the following steps: providing a semiconductor structure that includes a semiconductor base region of a first conductivity type and having a relatively long minority carrier diffusion length characteristic, between a semiconductor emitter region of a second conductivity type opposite to that of said first conductivity type, and a semiconductor drain region of said second conductivity type; providing, between said base region and said drain region, a semiconductor auxiliary region of said first conductivity type and having a relatively short minority carrier diffusion length characteristic; providing, within said base region, a region exhibiting quantum size effects; providing an emitter electrode coupled with said emitter region; providing a base/drain electrode coupled with said base region and said drain region; and applying signals with respect to said emitter and base/drain electrodes to obtain light emission from said semiconductor structure.

In an embodiment of this form of the invention, the step of providing a base/drain electrode comprises providing said base/drain electrode coupled with said base region, said auxiliary region, and said drain region. In this embodiment, the first conductivity type is p-type and the second conductivity type is n-type, said step of providing said semiconductor base region comprises providing a p-type base region having an average doping concentration of at least about $10^{19}/cm^3$ and said step of providing said auxiliary layer comprises providing p-type material having an average doping concentration of at least about $10^{19}/cm^3$.

In a further form of the invention, a method set forth for producing light emission from a semiconductor structure, including the following steps: providing a transistor that includes a semiconductor base region of a first conductivity type and having a relatively long minority carrier diffusion length characteristic, between a semiconductor emitter region of a second conductivity type, opposite to that of said first conductivity type, and a semiconductor collector region of said second conductivity type; providing, between said base region and said collector region, a semiconductor auxiliary region of said first conductivity type and having a relatively short minority carrier diffusion length characteristic; providing, within said base region, a region exhibiting quantum size effects; providing an emitter electrode coupled with said emitter region, a base electrode coupled with said base region, and a collector electrode coupled with said collector region; and applying signals with respect to said emitter, base, and collector electrodes to obtain light emission from said semiconductor structure.

Also set forth is an embodiment of a semiconductor light-emitting device, comprising: a semiconductor active region of a first conductivity type containing a quantum size region and having a first surface adjacent a semiconductor input region of a second conductivity type; a semiconductor output region that includes a semiconductor auxiliary layer of said first conductivity type adjacent a second surface, which opposes said first surface, of said active region, said auxiliary layer comprising a semiconductor material having a diffusion length for minority carriers of said first conductivity type material that is substantially shorter than the diffusion length for minority carriers of the semiconductor material of said active region; whereby, application of electrical potentials with respect to said active and input regions produces light emission from the active region of said semiconductor structure. In one embodiment, the output region further comprise a semiconductor drain region of said second conductivity type adjacent said semiconductor auxiliary layer, and in another embodiment, the output region further comprise a semiconductor collector region of said second conductivity type adjacent said semiconductor auxiliary layer.

Further features and advantages of the invention will become more readily apparent from the following detailed description when taken in conjunction with the accompanying drawings.

DETAILED DESCRIPTION

The diffusion length (L) of a minority carrier in the material of a semiconductor device is given as:

$$L = \sqrt{D \times \tau}$$

where, D, is the diffusion coefficient, which depends on the carrier mobility in the semiconductor, and $\mu$ is expressed in:

$$D = \mu \times \frac{kT}{q}$$

where q is the charge, T is temperature, and k is the Boltzmann constant. The carrier mobility, $\mu$, is proportional to the average scattering time, which is dependent, among many factors, on doping concentrations, defect concentrations, and semiconductor material composition (for example, GaAs versus AlGaAs (binary vs. alloy), or GaAs vs. InP (different material systems)). The minority carrier lifetime, $\tau$, is also dependent, among other factors, on free carrier concentrations (related to doping concentrations), defect energy levels, and defect concentration. In regions of short minority carrier diffusion lengths, minority carriers have higher probability of recombining with majority carriers per unit distance.

A tilted-charge device has an active region with built-in free majority carriers of one polarity, and on one input to this active region, only one species of minority carriers of another polarity are injected and allowed to diffuse across the active region. This active region has features that enhance the conduction of majority carriers and the recombination of minority carriers. On the output side of the region, minority carriers are then collected, drained, depleted or recombined by a separate and faster mechanism. Electrical contacts are coupled to this full-featured region.

An embodiment hereof employs a short minority diffusion length layer in a tilted charge device, for example, a light emitting transistor, a tilted charge light emitting diode, or a transistor laser. In this embodiment, the active region comprises doped layers engineered to have relatively long minority carrier diffusion length (ELDL), and quantum size region(s) for optical recombination. In the preferred embodiment, an engineered relatively short minority carrier diffusion length (ESDL) layer is provided after the active region, in the output region of the tilted charge device. The ESDL and ELDL layers are doped (directly or indirectly) to be of similar conductivity type (for example, a p-type material).

The technique of embodiments hereof allows the conductivity of majority carriers to be increased without increasing the active region thickness, in situations where a small active region is preferred for higher speed operation. This also enables the use of very small active regions (for example, less than about 25 nm) while still having the necessary thicknesses to reliably couple an electrical contact, and hence transport majority carriers to the active region.

Figure 1:
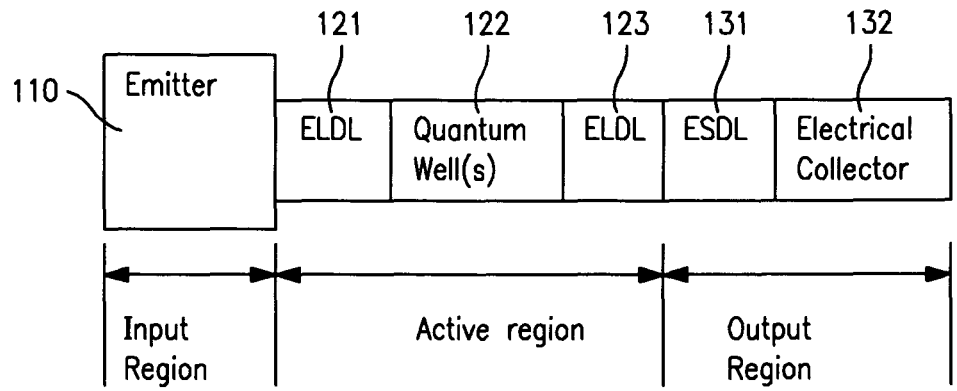
FIG. 1 is a simplified cross-sectional diagram, not to scale, of layers and regions of a tilted-charge light-emitting device that is useful in describing operation of embodiments of the invention that employ layers of engineered long diffusion length (ELDL) and engineered short diffusion length (ESDL) layers to obtain improved operation.

The simplified diagram of FIG. 1 illustrates the advantageous use of engineered long diffusion length (ELDL) and engineered short diffusion length (ESDL) layers in a tilted charge light-emitting semiconductor device. In the FIG. 1 diagram, the input region of the device is emitter 110. The active region of the device includes one or more quantum wells 122 between undoped or low doped barriers within engineered long diffusion length (ELDL) layers 121, 123. The output region of the device includes engineering short diffusion length (ESDL) layer 131 and an electrical collector 132, which may be, for example the collector of a light-emitting transistor or the drain of a tilted charge light-emitting diode. The active region of this tilted charge device has abundant built-in carriers (e.g. holes in a highly doped p-type region) and an input region where minority carriers are injected into the active region. In the output region, minority carriers are depleted and/or recombined and/or collected via a faster mechanism than the active region. As will be described hereinbelow, electrodes can be applied to the input and output regions for two terminal operation, and also to the active region for three terminal operation.

In order to improve the speed a tilted charge device, the transit time, $\tau_T$, has to be optimized. Since the transit time is proportional to the square of width, $W_{transit}^2$ (among other factors such as diffusion constants) of the region it is transiting, the overall base region ($W_{base}=W_{transit}$) is generally made thin. Thus, for example, in an optical tilted-charge device with an n-type emitter, this leads to relatively large lateral resistances (high resistivity) for the conduction of holes in the p-type base region. Such large resistances tend to limit the operation of the device to small areas along the edge of the emitter mesa. In an embodiment of the present invention, as represented in FIG. 1, the transit time can be maintained, while lowering the resistivity of the overall p-type region (including the base), by introducing the auxiliary layer (131) of engineered short diffusion length (ESDL) of low resistivity p-type material, which acts as a secondary mechanism that collects/drains and eliminates excess majority carriers. This effectively increases the base width without increasing the transit width (that is, $W_{base}>W_{transit}$). The p-type material preferably has a doping concentrations (e.g. carbon doping) of at least 1E19 $cm^{-3}$. Thereafter, a further collection or drain mechanism may be included. It will be understood that the same principle can also be applied to optical tilted-charge devices with p-type emitters and n-type bases, where the doping concentration of the ESDL auxiliary layer is at least 1E18 $cm^{-3}$.

Figure 2:
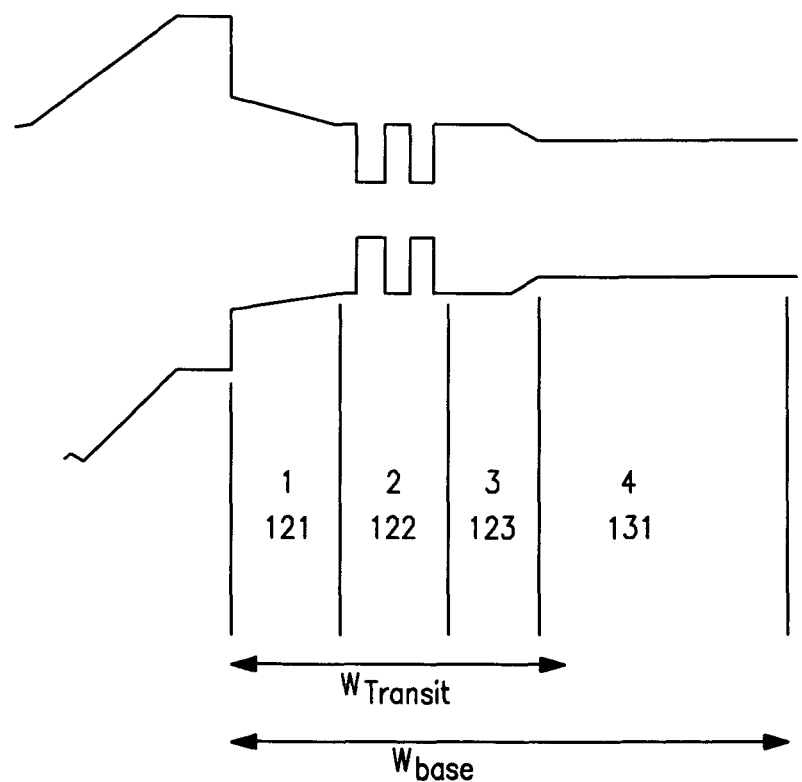
FIG. 2 is an energy band diagram of the type of device in FIG. 1 that useful in understanding operation of embodiments of the invention.

FIG. 2 illustrates the type of energy band diagram that characterizes embodiments of the FIG. 1 structure. In the example of FIG. 2, region 121, adjacent the emitter, can employ a relatively higher bandgap material than region 123 to form an asymmetric base (see copending U.S. Patent Application Publication No. US2010/0202484). As previously indicated, the material of layer 121 is engineered long diffusion length (ELDL) for minority carriers. Region 122 contains one or more quantum wells, with undoped or low doped barriers, and the layer 123 portion of the active region is also ELDL. The auxiliary layer 131 is engineered short diffusion length (ESDL) material with similar or lower bandgap than region 123. As previously described, since the relatively short diffusion length (higher defect concentration) material acts as a secondary mechanism that collects/drains majority carriers, the region 131 does not substantially increase the transit width $W_{transit}$, while serving to provide additional low resistivity paths for majority carriers (i.e., increased $W_{base}$).

Figure 8:
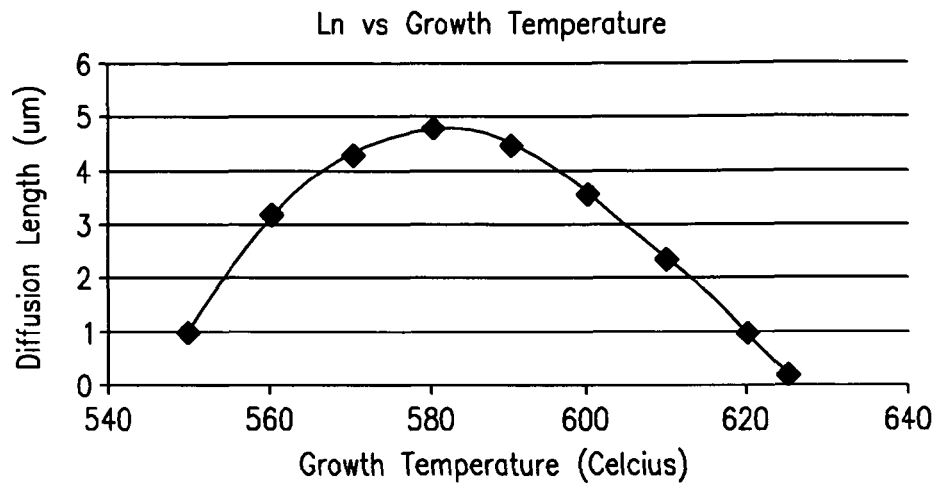
FIG. 8 is a graph showing an example of a characteristic of diffusion length of minority carriers, as a function of processing temperature.

The growth of a semiconductor epilayer, for example by methods of metal oxide chemical vapor deposition (MOCVD) or molecular beam epitaxy (MBE), requires precise control of several variables including gas flow rates, growth rates, growth temperature and vacuum. Post-growth processes may also affect the resulting overall material characteristics of the semiconductor. In one example hereof, the material quality may be tuned or optimized by varying the growth temperature of the semiconductor while keeping other variables as constant as possible. Such tuning results in a typical epilayer with diffusion length characteristics as shown in FIG. 8. (There are several known methods to measure the minority carrier diffusion length. One method, which was noted hereinabove, is to embed the studied layer as the base region of a heterojunction bipolar transistor structure.) FIG. 8 is a graph of diffusion length of minority carriers (electrons) in p-type GaAs material as a function of temperature variation. The resulting material has approximately the same sheet resistance. (In this example, there was a dopant concentration of ~4E19 $cm^{-3}$, and sheet resistance of ~165 Ohm/sq.)

FIG. 8 shows that there exists an optimum growth temperature, for a particular set of conditions, to maximize the material's diffusion length of minority carriers. By detuning from this optimum temperature, the diffusion length can be shortened with only small changes in the material's sheet resistance. In this example, an MOCVD process is used with a selected gas flow rate for a particular growth rate and vacuum setting, and the growth temperature is tuned to obtain an epilayer having the desired diffusion length characteristic. Thus, for example, to obtain a relatively long minority carrier diffusion length p-type GaAs semiconductor (it being understood that post-growth doping and annealing processes can also be employed, as appropriate), a growth temperature of about 580 degrees C. can be used to obtain substantially the maximum obtainable diffusion length, as seen in the diagram of FIG. 8. This can be the manner of forming, for example, the ELDL layers 121, 123 of the FIG. 1 example. When it is desired to grow an epilayer of engineered short diffusion length (ESDL) material in this example, a temperature of, say, 555 degrees C. or 605 degrees C. could be used to obtain a diffusion length of minority carriers that is about half the maximum obtainable diffusion length; that is, ESDL material (e.g. for layer 131 of FIG. 1) which has about half the diffusion length of the ELDL material of layers 121, 123. Preferably, an ESDL material will have a diffusion length that is less than about 0.7 times the material's layer thickness, whereas an ELDL material will have a diffusion length that is greater than the material's layer thickness.

Figure 9:
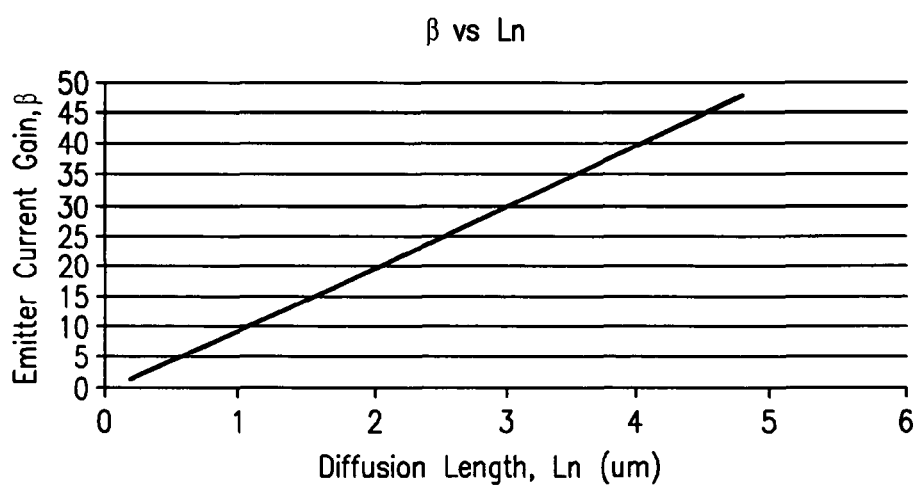
FIG. 9 a graph of showing an example of emitter current gain as a function of minority carrier diffusion length.

FIG. 9 shows how the emitter current gain of a InGaP/GaAs HBT with a base thickness of 100 nm and sheet resistance of about 165 Ohm sq., changes as a function of diffusion length. This demonstrates that longer diffusion length material exhibits proportionally higher β and, accordingly, less recombination of minority carriers.

Figure 3:
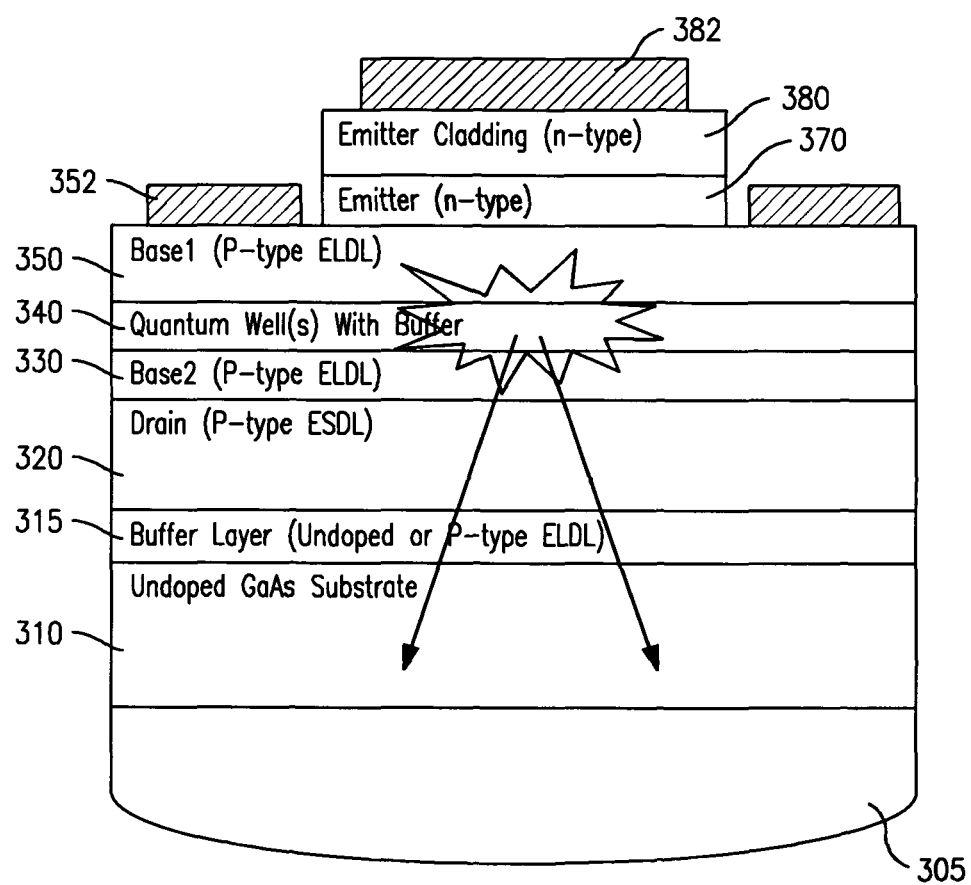
FIG. 3 is a cross-sectional view showing the layer structure (not to scale) of an embodiment of a tilted-charge light-emitting device in accordance with an embodiment of the invention.

FIG. 3 illustrates an embodiment of a tilted charge light emitting diode that employs a p-type engineered short diffusion length (ESDL) auxiliary layer, for bottom light emission. In this example, a GaAs buffer layer 315 is first grown on an undoped GaAs substrate 310. This buffer layer can be undoped or a p-type engineered long diffusion length layer. Next, a p-type GaAs engineered short diffusion length layer (ESDL) 320, which will serve as a drain, is grown on the buffer layer. Next, a p-type GaAs base-2 region 330 is grown as an engineered long diffusion length layer 330. A single or multiple quantum well region 340 is grown with undoped or low doped barrier layers. In this example, the quantum well(s) are InGaAs with GaAs barriers. The base region is then completed, as base-1 region with GaAs p-type ELDL layer. The base-1 region may or may not be of larger bandgap than the base-2 region (symmetric vs. asymmetric base design; see, again, the copending U.S. Patent Application Publication No. US2010/0202484). A relatively large bandgap InGaP or InAlGaP n-type emitter 370 is then grown, followed by an n-type emitter cladding layer 380 which comprises a contact layer and an optional oxidizable AlGaAs layer to form an electrical confining aperture. Ti—Pt—Au or AuGe is then metalized on the exposed surface of the p-type base region to form contact 352 to the p-type base material. This is followed by AuGe contact metallization 382 on the emitter mesa which also functions as a mirror to reflect light downward. Finally, a collimator or focusing lens 305 is then molded or affixed to the thinned down GaAs substrate. The device is operated under forward bias conditions, where the base bias voltage, VB and emitter bias voltage, VE, is biased so that VBE>EQW, where EQW is the energy gap of the quantum well. A partial DBR or full DBR cavity may also be incorporated into this structure. This embodiment, and others hereof, can also be operated as lasers by providing suitable resonant optical cavities.

Figure 4:
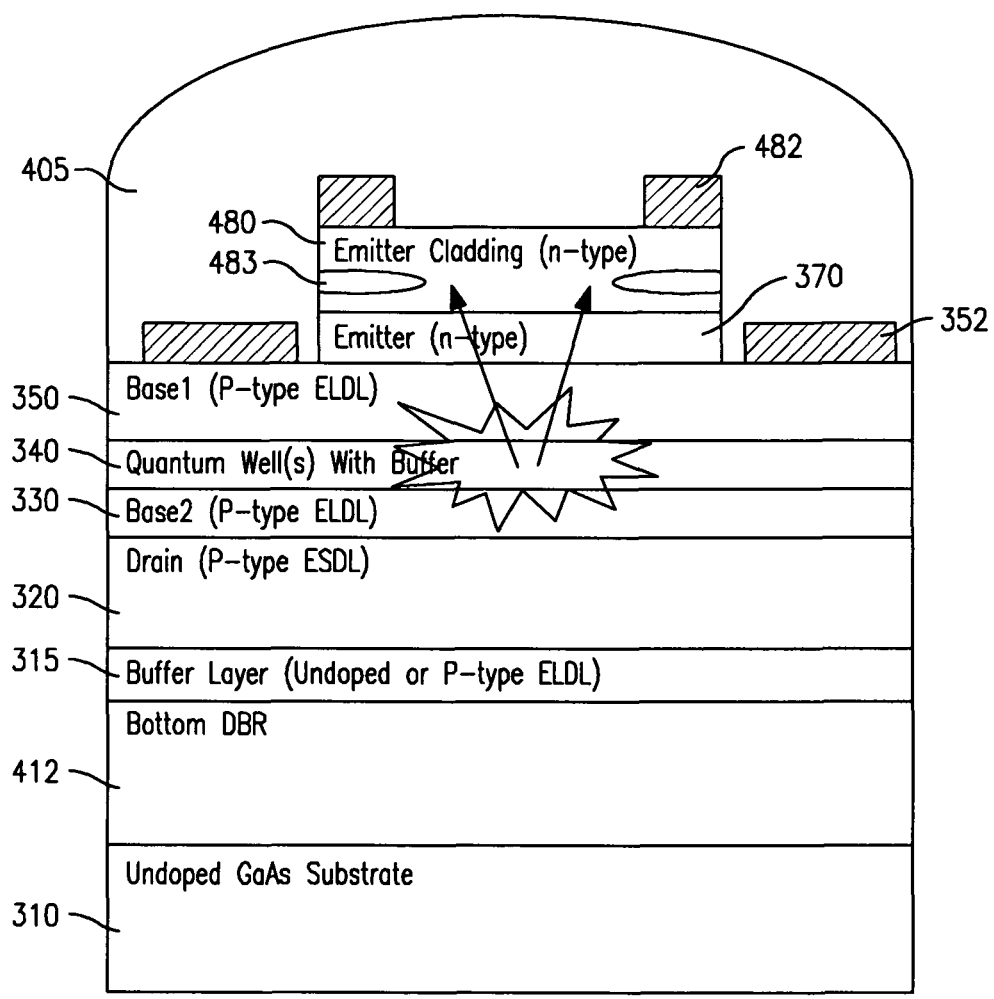
FIG. 4 is a cross-sectional view showing the layer structure (not to scale) of another embodiment of a tilted-charge light-emitting device in accordance with an embodiment of the invention.

Referring to FIG. 4, there is shown an embodiment of a tilted charge light-emitting diode that employs a p-type engineered short diffusion length (ESDL) for top light emission. In this embodiment, the layers 310, 315, 320, 340, 315, 320, 340, 350, and 370, and the contact 352 can be similar to their counterparts of like reference numerals in FIG. 3. For top light emission, the present embodiment employs an oxide aperture defined by annular oxidized region 483 in n-type emitter cladding region 480. A bottom distributed Bragg reflector (DBR) 412 is used to reflect light upward. An optional upper DBR (low reflectivity for spontaneous operation and high reflectivity for laser operation) can be embedded in the emitter cladding layer 480 for resonant cavity design. The emitter contact metallization 482 is in the form of an annular ring. A collimating or focusing lens is then molded or affixed onto the top surface. Operation can again be in forward biased mode.

Figure 5:
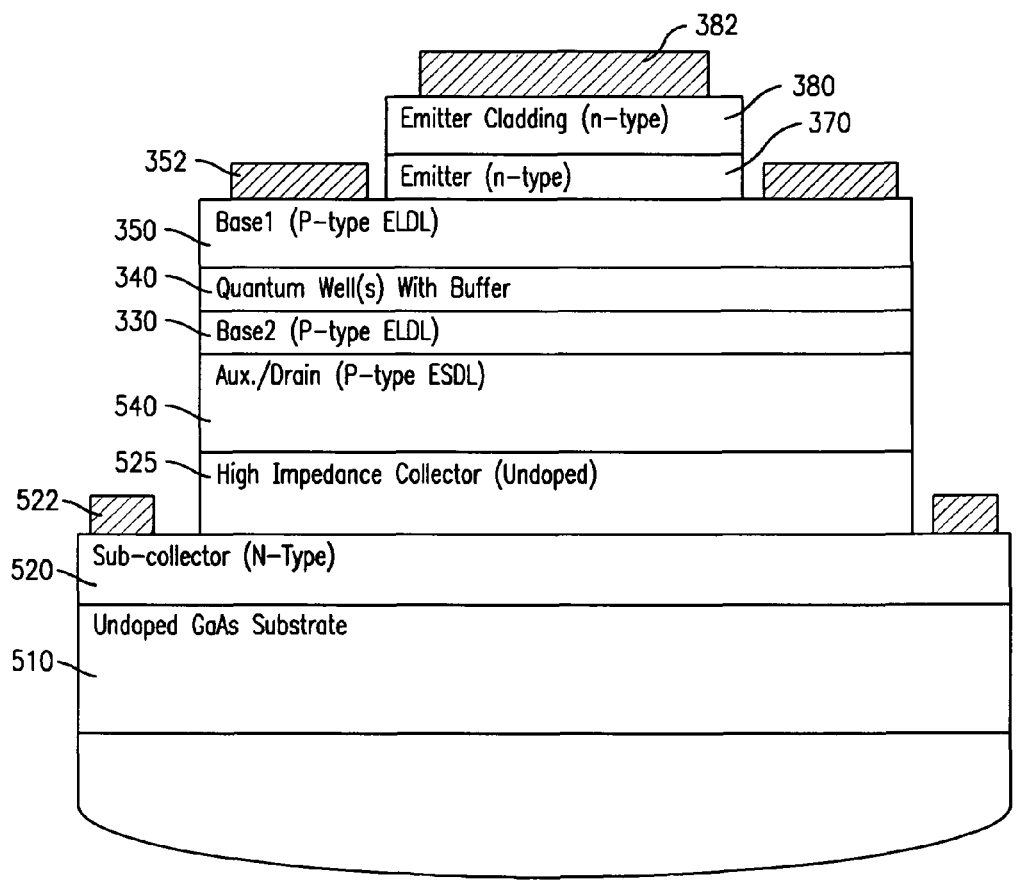
FIG. 5 is a cross-sectional view showing the layer structure (not to scale) of a further embodiment of a tilted-charge light-emitting device in accordance with an embodiment of the invention.

FIG. 5 shows an embodiment of a tilted-charge device in the form of a three terminal light-emitting transistor incorporating both an engineered short diffusion length (ESDL) auxiliary/drain region and a high impedance collector. In this embodiment, the device comprises undoped GaAs substrate 510, n-type subcollector 520 with contact 522, high impedance (undoped) collector 525, and p-type ESDL auxiliary/drain layer 540. The layers 330, 340, 350, 370, and 380, and the contacts 352 and 382 can be similar to their counterparts of like reference numerals in FIG. 3. The device can be operated in common base, common collector, or common emitter mode.

Figure 6:
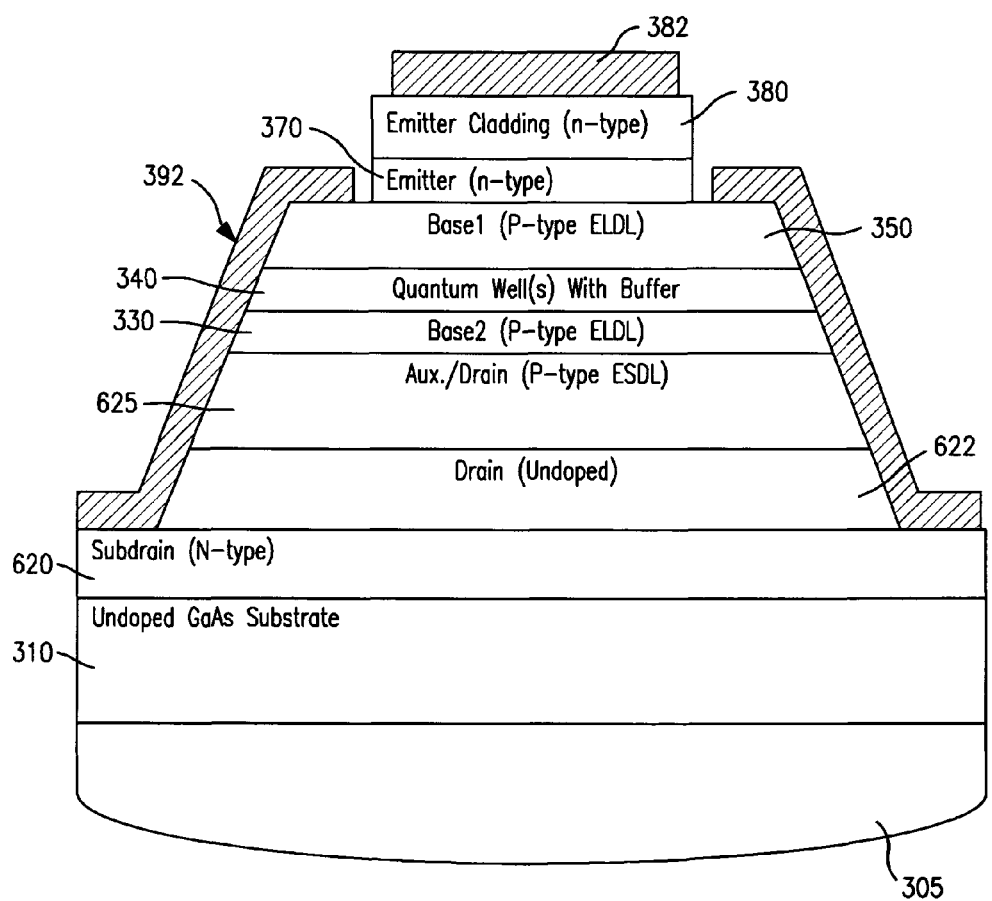
FIG. 6 is a cross-sectional view showing the layer structure (not to scale) of another embodiment of a tilted-charge light-emitting device in accordance with an embodiment of the invention.

FIG. 6 shows an embodiment of a tilted-charge light-emitting diode with an engineered short diffusion length (ESDL) layer. In this embodiment, the base-2 layer 330, quantum wells, with buffer region 340, base-1 layer 350, emitter layer 370, emitter lading 382 and emitter contact, as well as the undoped GaAs substrate 310 and the bottom collimating or focusing lens 305, can be similar to their counterparts of like reference numerals in the FIG. 3 embodiment. In the present embodiment, an n-type subdrain layer 620 is grown on the substrate, and then, undoped drain layer 622. Deposited on the drain layer 622 is auxiliary drain layer 625, which is grown as an engineered short diffusion length (ESDL) layer. The deposition of the further layers, as was previously described, is implemented, with the mesas being formed as shown. Then, the metalizations are formed for emitter contact 382 and base/drain contact 392, which has annular upper and lower portions that contact the respective shelves of base layer 350 and subdrain layer 620, and sides that contact the peripheral edges of the intervening layers.

Figure 7:
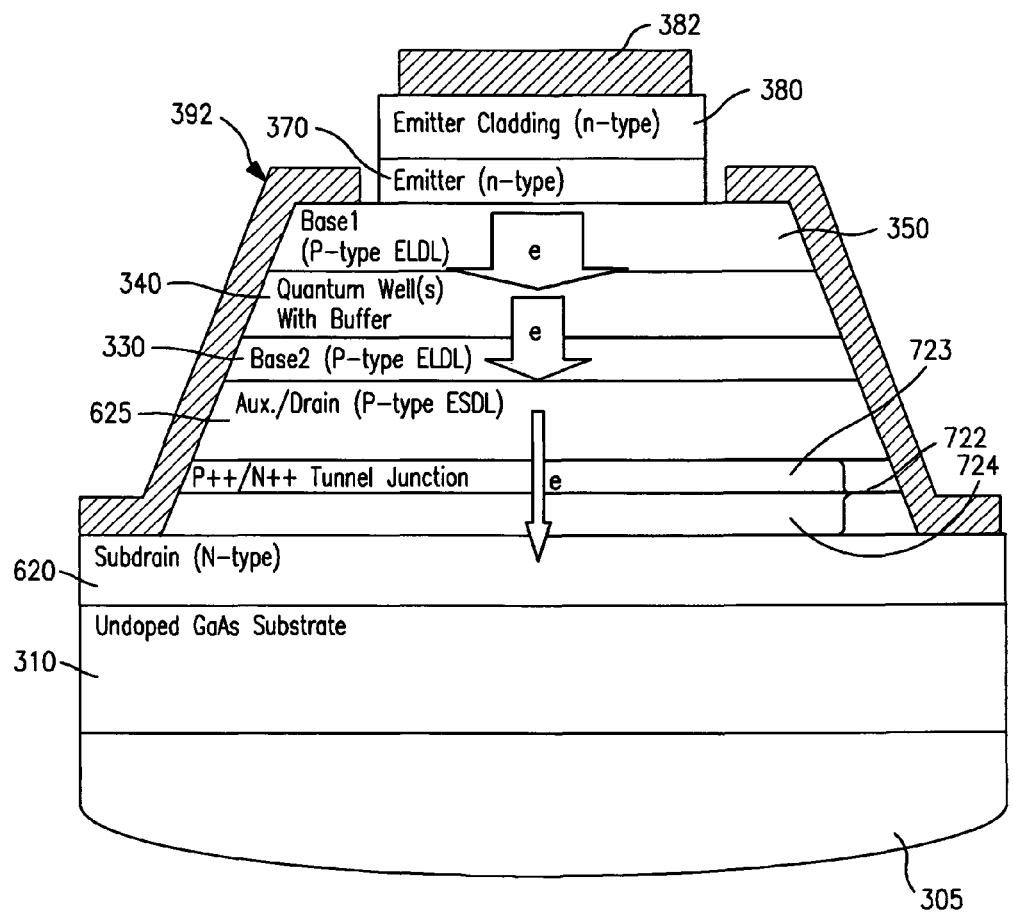
FIG. 7 is a cross-sectional view showing the layer structure (not to scale) of a further embodiment of a tilted-charge light-emitting device in accordance with an embodiment of the invention.

FIG. 7 shows an embodiment of another tilted-charge light-emitting diode with an embedded engineered short diffusion length (ESDL) layer. The general configuration and layer structure is similar to that of the FIG. 6 embodiment (as indicated by like reference numerals indicating corresponding elements), but the FIG. 7 embodiment has tunnel Junction 722 in place of the FIG. 6 drain layer 622. The tunnel junction 722 comprises heavily doped ($p^{++}$) region 723 adjacent heavily doped ($n^{++}$) region 724. (Reference can be made to U.S. Patent Application Publication No. US2010/0202483, for description of a tilted-charge light-emitting device employing a tunnel junction.) In operation, the ESDL auxiliary drain layer 625 serves to reduce the avalanche current across the tunnel junction by reducing the base-drain electron current flow (as represented in the diagram by the narrowing arrow width).

The invention claimed is:

1. For use in conjunction with a light-emitting semiconductor structure that includes a semiconductor active region of a first conductivity type containing a quantum size region and having a first surface adjacent a semiconductor input region of a second conductivity type that is operative, upon application of electrical potentials with respect to said active and input regions, to produce light emission from said active region, a method for enhancing operation of said light-emitting semiconductor structure, comprising: providing a semiconductor output region that includes a semiconductor auxiliary layer of said first conductivity type adjacent a second surface, which opposes said first surface of said active region, and providing said auxiliary layer as comprising a semiconductor material having a diffusion length for minority carriers of said first conductivity type material that is substantially shorter than the diffusion length for minority carriers of the semiconductor material of said active region.

2. The method as defined by claim 1, wherein said step of providing said output region further includes providing a semiconductor drain region of said second conductivity type adjacent said semiconductor auxiliary layer.

3. The method as defined by claim 1, wherein said step of providing said output region further includes providing a semiconductor collector region of said second conductivity type adjacent said semiconductor auxiliary layer.

4. The method as defined by claim 1, wherein said step of providing said output region that includes a semiconductor auxiliary layer adjacent said second surface of said active region comprises providing said auxiliary layer of a semiconductor material having substantially the same elemental constituents as the semiconductor material of said second surface of said active region.

5. The method as defined by claim 4, wherein said step of providing said auxiliary layer of a semiconductor material having substantially the same elemental constituents as said second surface of said active region comprises providing both of said semiconductor materials as substantially GaAs.

6. The method as defined by claim 1, further comprising disposing said active region in an optical resonant cavity, and wherein said light emission is laser emission.

7. A method for producing light emission from a semiconductor structure, comprising the steps of:
providing a transistor that includes a semiconductor base region of a first conductivity type and having a relatively long minority carrier diffusion length characteristic, between a semiconductor emitter region of a second conductivity type, opposite to that of said first conductivity type, and a semiconductor collector region of said second conductivity type;
providing, between said base region and said collector region, a semiconductor auxiliary region of said first conductivity type and having a relatively short minority carrier diffusion length characteristic;
providing, within said base region, a region exhibiting quantum size effects;
providing an emitter electrode coupled with said emitter region, a base electrode coupled with said base region, and a collector electrode coupled with said collector region; and
applying signals with respect to said emitter, base, and collector electrodes to obtain light emission from said semiconductor structure.

8. The method as defined by claim 7, wherein said first conductivity type is p-type and said second conductivity type is n-type.

9. The method as defined by claim 8, wherein said step of providing said semiconductor base region comprises providing a p-type base region having an average doping concentration of at least about $10^{19}/cm^3$ and said step of providing said auxiliary layer comprises providing p-type material having an average doping concentration of at least about $10^{19}/cm^3$.

10. The method as defined by claim 8, wherein said first conductivity type is n-type and said second conductivity type is p-type.

11. The method as defined by claim 10, wherein said step of providing said semiconductor base region comprises providing an n-type base region having an average doping concentration of at least about $10^{18}/cm^3$, and said step of providing said auxiliary layer comprises providing n-type material having an average doping concentration of at least about $10^{18}/cm^3$.

12. A semiconductor light-emitting device, comprising:
a semiconductor active region of a first conductivity type containing a quantum size region and having a first surface adjacent a semiconductor input region of a second conductivity type;
a semiconductor output region that includes a semiconductor auxiliary layer of said first conductivity type adjacent a second surface, which opposes said first surface, of said active region, said auxiliary layer comprising a semiconductor material having a diffusion length for minority carriers of said first conductivity type material that is substantially shorter than the diffusion length for minority carriers of the semiconductor material of said active region;
whereby, application of electrical potentials with respect to said active and input regions produces light emission from the active region of said semiconductor structure.

13. The device as defined by claim 12, wherein said output region further comprise a semiconductor drain region of said second conductivity type adjacent said semiconductor auxiliary layer.

14. The device as defined by claim 12, wherein said output region further comprise a semiconductor collector region of said second conductivity type adjacent said semiconductor auxiliary layer.

15. The device as defined by claim 12, wherein said output region that includes a semiconductor auxiliary layer adjacent said second surface of said active region comprises a semiconductor material having substantially the same elemental constituents as the semiconductor material of said second surface of said active region.

16. The device as defined by claim 15, wherein said semiconductor material having substantially the same elemental constituents as said second surface of said active region comprises substantially GaAs.

* * * * *